United States Patent [19]
Prakash et al.

[11] Patent Number: 4,987,388
[45] Date of Patent: Jan. 22, 1991

[54] CRYSTAL OSCILLATOR OPERATED IN PARALLEL/SERIES MODE

[75] Inventors: Chacko Prakash; Yong K. Ng; Pek B. Teo, all of Penang, Malaysia

[73] Assignee: Motorola, Inc., Schaumburg, Ill.

[21] Appl. No.: 518,387

[22] Filed: May 3, 1990

[51] Int. Cl.⁵ .............................................. H03B 5/32
[52] U.S. Cl. ................................................... 331/158
[58] Field of Search ........................ 331/154, 158, 175

[56] References Cited
U.S. PATENT DOCUMENTS

| | | | |
|---|---|---|---|
| 4,797,639 | 1/1989 | Driscoll | 331/158 |
| 4,843,349 | 6/1989 | Nugent et al. | 331/158 X |
| 4,864,256 | 9/1989 | Barnert | 331/158 X |

Primary Examiner—Robert J. Pascal
Attorney, Agent, or Firm—Eugene A. Parsons

[57] ABSTRACT

Eliminating self quieting in a receiver by operating the crystal oscillator in a parallel mode of operation until a harmonic falls within the passband of the receiver and then switching the oscillator to a series mode of operation, which is separated sufficiently from the parallel mode of operation so that no harmonics fall within the passband.

14 Claims, 1 Drawing Sheet

CRYSTAL OSCILLATOR OPERATED IN PARALLEL/SERIES MODE

The present invention pertains to the elimination of self quieting in crystal oscillators used in receivers and more specifically to the operation of a single crystal oscillator in two different modes to provide two widely separated clock frequencies for use in the microprocessor of a receiver in a communications transceiver.

BACKGROUND OF THE INVENTION

In the field of communications transceivers, microprocessors are utilized for controlling the transceiver as well as much of the signal processing. The microprocessor is in turn controlled by a crystal oscillator which provides clock pulses for the operation of the microprocessor. Interference, or self quieting, occurs when harmonics of the clock frequency of the crystal oscillator fall within the passband of the receiver in the transceiver, because the receiver cannot distinguish between a valid carrier and the harmonic.

Self quieting can be eliminated if two separate clock frequencies are provided with harmonics that do not simultaneously fall within the passband of the receiver. The problem is that a large frequency shift, or separation is required between the two frequencies, especially in lowband frequency operation. This large frequency shift is difficult to be implemented using single crystal oscillators. Crystal are generally stiff and can be shifted to a maximum of about 300 parts per million (PPM) or cycles per megahertz of operating frequency without much problem. However, this amount of shift is not sufficient, especially in lowband operation.

SUMMARY OF THE INVENTION

It is an object of the present invention to provide a new and improved transceiver including a crystal oscillator with self quieting eliminated.

It is a further object of the present invention to provide a new and improved crystal oscillator with the capability of providing two frequencies separated sufficiently to eliminate the possibility of self quieting in a receiver.

It is a further object of the present invention to provide a new method and apparatus for operating a crystal oscillator to provide two frequencies which are separated more than is practical by normal shifting of the oscillator frequencies.

These and other objects of the present invention are realized in a transceiver including a crystal oscillator with a crystal, first and second components and switching means for connecting the crystal and first components in a parallel mode of operation and for connecting the crystal and the second components in a series mode of operation when harmonics of the frequency produced by the parallel mode of operation fall within the passband of the receiver.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
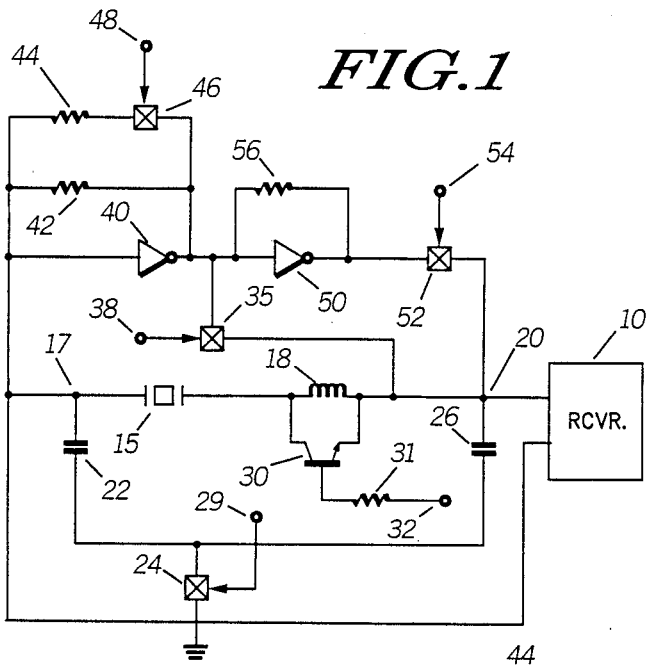
FIG. 1 is a schematic diagram of a transceiver containing a crystal oscillator embodying the present invention.

Referring specifically to FIG. 1, a schematic diagram of a transceiver including a crystal oscillator embodying the present invention is illustrated. A receiver 10 of the transceiver includes a crystal oscillator 12 utilized to produce a clock frequency for a microprocessor (not shown) in receiver 10. In this particular embodiment, receiver 10 is constructed to operate at least part of the time at lowband frequencies.

Oscillator 12 includes a crystal 15 having one side connected to a node 17 and the other side connected through an inductance 18 to a second node 20. Nodes 17 and 20 serve as the output of oscillator 12 and are connected to a clock input of receiver 10 in a well known manner. One side of a capacitor 22 is connected to node 17 and the other side is connected to one terminal of a switch 24, the other terminal of which is connected to a reference voltage, such a ground. One side of a second capacitor 26 is connected to node 20 and the other side is connected to the one terminal switch 24. Switch 24 has a control terminal connected to a control voltage input terminal 29.

In this embodiment, inductance 18 is illustrated as a simple coil and the collector terminal of a transistor 30 is connected to one end thereof with the emitter terminal of transistor 30 connected to the other end. The base terminal of transistor 30 is connected through a resistor 31 to a control voltage terminal 32. Transistor 30 is a switching type transistor that provides a virtual short circuit across inductance 18, taking inductance 18 out of the circuit, when transistor 30 is turned on and which has a little or no effect or inductance 18 when it is turned off.

Node 20 is also connected through a switch 35 to a third node 37. Switch 35 has a control terminal connected to a control voltage input 38. A first inventor 40 has an input connected to node 17 and an output connected to node 37. A resistor 42 is connected from the input to the output of invertor 40. A second resistor 44 is connected from the input or invertor 40, through a switch 46, to the output of invertor 40. Switch 46 has a control terminal connected to control voltage input terminal 48. A second invertor 50 has an input connected to node 37 and an output connected through a switch 52 to node 20. Switch 52 has a control terminal connected to a control voltage input 54. A resistor 56 is connected between the input and the output of the invertor 50.

In this embodiment switches 24, 35, 46 and 52 are analog switches which may be, for example, switches available commercially as a semiconductor product MC 14066. Control voltage inputs 29, 32 and 38 are connected together and all receive the same control voltage Vc. Also, control voltage terminals 48 and 54 are connected together and both receive a control voltage that is the inverse, Vc, of control voltage Vc. Further, in this embodiment inventors 40 and 50 are HCMOS devices for speed and compatibility.

Figure 2:
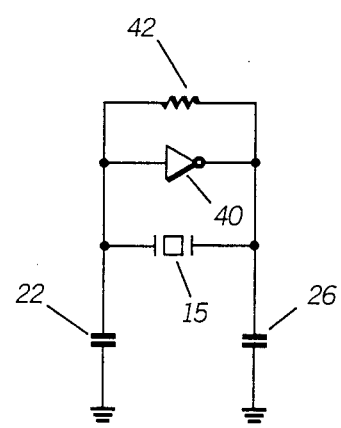
FIG. 2 is an equivalent circuit of the crystal oscillator of FIG. 1 connected in a parallel mode of operation.

When Vc is high, switches 24 and 35 are closed or conducting and transistor 30 is conducting, while switches 46 and 52 are open or nonconducting. Thus the crystal oscillator circuit appears as illustrated in FIG. 2. Capacitors 22 and 26 are connected in series and the series connection is connected in parallel with crystal 15. During this connection, crystal oscillator 12 operates in a parallel mode of operation, producing a first clock frequency fp.

Figure 3:
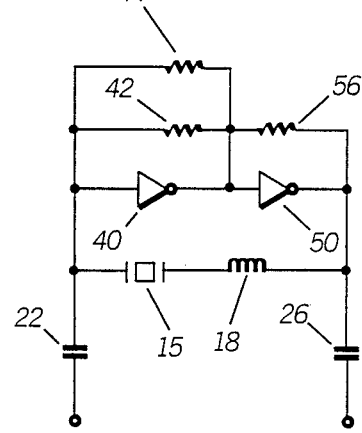
FIG. 3 is an equivalent circuit of the crystal oscillator of FIG. 1 connected in a series mode of operation.

When Vc is low, switches 24 and 35 are open or nonconducting and transistor 30 is nonconducting. Also, Vc is high so that switches 46 and 52 are closed or conducting. Thus, the crystal oscillator circuit appears as illustrated in FIG. 3. Inductance 18 is connected in series with crystal 15 and crystal oscillator 12 operates in a series mode of operation, producing a second clock frequency fs. Since at series resonance there is no phase shift, two inventors 40 and 50 are connected in series between the input and output to provide an overall phase shift of 360 degrees to sustain oscillation. The amount or size of inductance 18 determines the amount of separation of fs from fp. It is possible that little or no inductance in the series mode of operation could still result in sufficient separation of fs from fp in certain embodiments. Capacitors 22 and 26 are not required in the series mode of operation.

Figure 4:
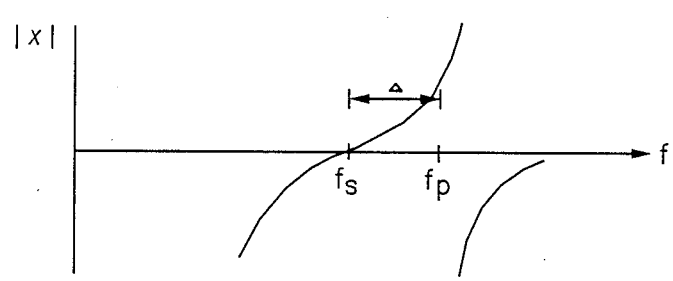
FIG. 4 is a graphic representation of the frequency separation produced by the change in modes of operation.

The properties of the crystal in the series and parallel modes of operation are shown in FIG. 4. A greater shift in operating frequency is possible in the series mode, since the slope is gentler than is in the parallel mode, as shown in FIG. 4. The series resonant frequency, fs, is shifted by adding inductance 18 in series with crystal 15. The separation, delta, is the amount required to be sure that harmonics of fs will not appear in the bandpass of receiver 10 when harmonics of fp appear. A delta of 400 ppm was easily achieved, which delta is generally sufficient for the purpose of eliminating self quieting. In this embodiment, crystal oscillator 12 is normally operated in the parallel mode, FIG. 2, and switched to series mode, FIG. 3, whenever a self quieting frequency is encountered. It will of course be understood that the crystal oscillator could as easily be normally operated in the series mode and switched to the parallel mode whenever self quieting frequencies are encountered.

Thus, a new and improved crystal oscillator and method of operation is disclosed which operates in the series and parallel modes to provide two frequencies separated sufficiently far to eleminate self quieting. Further, the crystal oscillator uses a minimum of components and is simple and inexpensive to construct. In fact, the main portions of the structure can easily be included on an IC chip and, because of the minimum size, can easily be incorporated in portable transceivers.

While we have shown and described a specific embodiment of the present invention, further modifications and improvements will occur to those skilled in the art. We desire it to be understood therefore, that this invention is not limited to the particular forms shown and we intend in the appended claims to cover all modifications and do not depart from the spirit and scope of this invention.

What we claim is:

1. A crystal oscillator comprising a crystal, an inductance, a capacitance and switching means for connecting said crystal and said capacitance in parallel to provide a first frequency in a parallel mode of operation and for connecting said crystal and said inductance in series to provide a second frequency different than said first frequency in a series mode of operation, said first and second frequencies being separated by a predetermined amount.

2. A crystal oscillator as claimed in claim 1 including in addition two invertors connected in parallel with the crystal and the inductance in the series mode of operation.

3. In a transceiver including a receiver with a predetermined passband, a method of substantially eliminating self quieting comprising the steps of:
 providing an oscillator with a crystal;
 connecting first components in parallel with the crystal to provide a first frequency in a parallel mode of operation; and
 disconnecting the first components and connecting second components in series with the crystal to provide a second frequency in a series of operation when a harmonic of the first frequency falls within the passband of the receiver.

4. A method of substantially eliminating self quieting as claimed in claim 3 wherein the step of connecting first components includes the step of selecting a capacitance as one of the first components which will provide the first frequency.

5. A method of substantially eliminating self quieting as claimed in claim 3 wherein the step of disconnecting the first components and connecting second components includes the step of selecting an inductance as one of the second components which will provide the second frequency.

6. In a transceiver including a receiver with a predetermined passband, a method of substantially eliminating self quieting comprising the steps of:
 providing an oscillator with a crystal;
 connecting a capacitance in parallel with the crystal to provide a first frequency in a parallel mode of operation;
 disconnecting the capacitance and connecting an inductance in series with the crystal to provide a second frequency in a series mode of operation when a harmonic of the first frequency falls within the passband of the receiver.

7. A method of substantially eliminating self quieting as claimed in claim 6 including in addition the step of providing feedback to the crystal for sustaining oscillations in the series mode of operation.

8. A transceiver comprising:
 a receiver with a predetermined passband; and
 a crystal oscillator connected to said receiver and including a crystal, first electrical components, second electrical components and switching means for connecting said crystal and said first electrical components in parallel to provide a first frequency in a parallel mode of operation and for connecting said crystal and said second electrical components in series to provide a second frequency different than said first frequency in a series mode of operation, said first and second frequencies being separated by a predetermined amount.

9. A transceiver as claimed in claim 8 wherein the predetermined amount of separation of the first and second frequencies is greater than is practical by shifting the operating frequency of the crystal without changing operating modes.

10. A transceiver as claimed in claim 9 wherein the predetermined amount of separation of the first and second frequencies is greater than 300 cycles per megahertz of operating frequency.

11. A transceiver as claimed in claim 8 wherein the first electrical components include a capacitor.

12. A transceiver as claimed in claim 8 wherein the second electrical components include an inductor.

13. A transceiver as claimed in claim 12 wherein the second electrical components further include a phase for producing 360 degrees of phase in a feedback circuit connected to the crystal to sustain oscillations.

14. A transceiver as claimed in claim 13 wherein the phase shifter includes two invertors connected in series.

* * * * *

UNITED STATES PATENT AND TRADEMARK OFFICE
CERTIFICATE OF CORRECTION

PATENT NO. : 4,987,388
DATED : January 22, 1991
INVENTOR(S) : Prakash, et al It is certified that error appears in the above-identified patent and that said Letters Patent is hereby corrected as shown below:

Column 5, line 4, at the end of the line, after "phase" insert -- shifter --.

Column 6, line 1, after "phase" and before "in" insert -- shift --.

Signed and Sealed this

Seventh Day of July, 1992

Attest:

DOUGLAS B. COMER

*Attesting Officer*　　　　*Acting Commissioner of Patents and Trademarks*